(12) United States Patent
Thompson et al.

(10) Patent No.: US 11,562,949 B2
(45) Date of Patent: Jan. 24, 2023

(54) SEMICONDUCTOR PACKAGE INCLUDING UNDERMOUNTED DIE WITH EXPOSED BACKSIDE METAL

(71) Applicant: TEXAS INSTRUMENTS INCORPORATED, Dallas, TX (US)

(72) Inventors: Patrick Francis Thompson, Allen, TX (US); Christopher Daniel Manack, Flower Mound, TX (US); Madison Paige Koziol, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/904,193

(22) Filed: Jun. 17, 2020

(65) Prior Publication Data
US 2021/0398882 A1   Dec. 23, 2021

(51) Int. Cl.
*H01L 23/495* (2006.01)
*H01L 23/34* (2006.01)
(Continued)

(52) U.S. Cl.
CPC .......... *H01L 23/4952* (2013.01); *H01L 21/56* (2013.01); *H01L 23/28* (2013.01);
(Continued)

(58) Field of Classification Search
CPC ... H01L 27/13; H01L 27/0288; H01L 23/495; H01L 23/28; H01L 23/49838;
(Continued)

(56) References Cited

U.S. PATENT DOCUMENTS 3,915,729 A   10/1975   Eustice
5,926,695 A    7/1999   Chu et al.
(Continued)

FOREIGN PATENT DOCUMENTS

JP   2011029585 A    2/2011
RU     2351037 C1    3/2009
RU       89283 U1   11/2009

OTHER PUBLICATIONS

U.S. Appl. No. 16/537,517, titled Package With Stacked Power Stage and Integrated Control Die, filed Aug. 9, 2019.
(Continued)

*Primary Examiner* — Alonzo Chambliss
(74) *Attorney, Agent, or Firm* — Ronald O. Neerings; Frank D. Cimino (57) ABSTRACT

A semiconductor package includes a semiconductor die with an active surface and an inactive surface, the active surface including metal pillars providing electrical connections to functional circuitry of the semiconductor die, and a backside metal layer on the inactive surface. The backside metal layer is attached to the inactive surface. The semiconductor package further includes a plurality of leads with each of the leads including an internal leadfinger portion and an exposed portion that includes a bonding portion. Distal ends of the metal pillars are in contact with and electrically coupled to the internal leadfinger portions. The backside metal layer is exposed on an outer surface of the semiconductor package. The bonding portions and the backside metal layer approximately planar to each other.

29 Claims, 8 Drawing Sheets

(51) Int. Cl.
- *H01L 23/48* (2006.01)
- *H01L 21/00* (2006.01)
- *H05K 7/04* (2006.01)
- *H05K 7/18* (2006.01)
- *H01L 23/498* (2006.01)
- *H01L 23/00* (2006.01)
- *H01L 21/56* (2006.01)
- *H01L 23/31* (2006.01)
- *H01L 23/28* (2006.01)

(52) U.S. Cl.
CPC ...... *H01L 23/3107* (2013.01); *H01L 23/4951* (2013.01); *H01L 23/49541* (2013.01); *H01L 23/49575* (2013.01); *H01L 23/49838* (2013.01); *H01L 24/17* (2013.01); *H01L 24/81* (2013.01)

(58) Field of Classification Search
CPC ............. H01L 23/4952; H01L 23/4951; H01L 23/49541; H01L 23/49575; H01L 23/563; H01L 23/3107; H01L 24/17; H01L 24/16; H01L 24/81; H01L 21/56
See application file for complete search history.

(56) References Cited

U.S. PATENT DOCUMENTS

| | | | |
|---|---|---|---|
| 5,994,768 A | 11/1999 | Fogelson | |
| 6,061,251 A | 5/2000 | Hutchinson et al. | |
| 6,064,115 A | 5/2000 | Moscicki | |
| 6,066,515 A | 5/2000 | Schoenfeld | |
| 6,072,228 A | 6/2000 | Hinkle et al. | |
| 6,078,102 A | 6/2000 | Crane, Jr. et al. | |
| 6,215,176 B1 | 4/2001 | Huang | |
| 6,372,579 B1 | 4/2002 | Tung | |
| 6,448,107 B1 | 9/2002 | Hong et al. | |
| 6,483,180 B1 | 11/2002 | Bayan et al. | |
| 6,515,353 B2 | 2/2003 | Stave | |
| 6,603,197 B1 | 8/2003 | Yoshida et al. | |
| 7,122,884 B2 * | 10/2006 | Cabahug | H01L 23/49562 257/676 |
| 7,211,467 B2 | 5/2007 | Park et al. | |
| 7,772,685 B2 | 8/2010 | Huang et al. | |
| 7,842,541 B1 | 11/2010 | Rusli et al. | |
| 8,026,589 B1 | 9/2011 | Kim et al. | |
| 8,203,199 B2 | 6/2012 | Lee et al. | |
| 8,222,716 B2 | 7/2012 | Bayan | |
| 8,304,871 B2 | 11/2012 | Yu et al. | |
| 8,450,149 B2 | 5/2013 | Bayan et al. | |
| 8,546,925 B2 | 10/2013 | Herbsommer et al. | |
| 9,184,121 B2 | 11/2015 | Lopez et al. | |
| 9,412,717 B2 | 8/2016 | Chen et al. | |
| 9,496,208 B1 | 11/2016 | Ostrowicki | |
| 9,589,929 B2 | 3/2017 | Terrill et al. | |
| 9,711,436 B2 | 7/2017 | Gehrke | |
| 9,870,984 B2 | 1/2018 | Ranmuthu | |
| 9,966,330 B2 | 5/2018 | Terrill et al. | |
| 2003/0193080 A1 * | 10/2003 | Cabahug | H01L 23/49562 257/666 |
| 2006/0151861 A1 * | 7/2006 | Noquil | H01L 23/488 257/676 |
| 2006/0231933 A1 * | 10/2006 | Cabahug | H01L 23/49562 257/666 |
| 2007/0001274 A1 | 1/2007 | Hinkle et al. | |
| 2009/0115035 A1 * | 5/2009 | Bayan | H01L 23/4952 257/673 |
| 2009/0230517 A1 * | 9/2009 | Bathan | H01L 25/03 257/666 |
| 2010/0193934 A1 * | 8/2010 | Satou | H01L 24/97 257/692 |
| 2011/0287587 A1 * | 11/2011 | Hung | H01L 23/3128 438/122 |
| 2012/0228696 A1 | 9/2012 | Carpenter et al. | |
| 2012/0326287 A1 | 12/2012 | Joshi et al. | |
| 2013/0099377 A1 * | 4/2013 | Yu | H01L 24/97 257/737 |
| 2013/0127029 A1 | 5/2013 | Lee et al. | |
| 2013/0181332 A1 * | 7/2013 | Kelkar | H01L 23/49541 257/666 |
| 2013/0230947 A1 | 9/2013 | Hsu et al. | |
| 2014/0063744 A1 | 3/2014 | Lopez et al. | |
| 2017/0170101 A1 | 6/2017 | Arguelles et al. | |
| 2019/0013288 A1 | 1/2019 | Kim et al. | |
| 2020/0194357 A1 | 6/2020 | Shibuya et al. | |
| 2020/0194390 A1 | 6/2020 | Kim et al. | |

OTHER PUBLICATIONS

TLV6256xA 1-A, 2-A Step Down Converter with Forced PWM in SOT563 Package, Texas Instruments Incorporated, Dallas, Texas, Mar. 2020.

International Search Report dated Sep. 16, 2021.

* cited by examiner

SEMICONDUCTOR PACKAGE INCLUDING UNDERMOUNTED DIE WITH EXPOSED BACKSIDE METAL

TECHNICAL FIELD

This disclosure relates to semiconductor packages.

BACKGROUND

Electronic package technology continues trends towards miniaturization, integration, and speed. For a semiconductor package that includes at least one semiconductor die therein, particularly for integrated circuits (ICs), heat dissipation is an important issue.

Semiconductor packages provide support for an integrated circuit chip or semiconductor die and associated bond wires or other interconnects, provide protection from the environment, and enable surface mounting of the die to and interconnection with a printed circuit board (PCB). Leadframe semiconductor packages are well known and widely used in the electronics industry to house, mount, and interconnect a variety of ICs.

A conventional leadframe is typically die-stamped from a sheet of flat-stock metal, and includes a plurality of metal leads temporarily held together in a planar arrangement about a central region during package manufacture by a rectangular frame. A mounting pad for a semiconductor die is supported in the central region by "tie-bars" that attach to the frame. The leads extend from a first end integral with the frame to an opposite second end adjacent to, but spaced apart from, the die pad.

One conventional package configuration includes a leadframe having a die pad and wire bond pads. Wire bonds electrically connect die bond pads with the wire bond pads of the leadframe.

An alternative to wire bonds is flip-chip on leadframe packages. In a placement step, a die having solder bumps on its input/output (TO) or bond pads is flipped onto a lead frame including a die pad and/or a plurality of leads including internal leadfingers sometimes called bondfingers. A solder bump reflow process follows resulting in the die being bonded to the die pad and the bumps on the bond pads being electrically coupled to the leadfingers. For flip-chip Small Outline Transistor (SOT) packages, the flip-chip die is mounted directly on the leadfingers with no die pad followed by a solder bump reflow.

BRIEF SUMMARY

Packages disclosed herein include a semiconductor die undermounted on internal leadfingers with an exposed backside surface facilitating a direct thermal path from the semiconductor die to a workpiece such as a printed circuit board (PCB). Disclosed packages further include copper pillar connections between the active surface of the undermounted semiconductor die and the leadframe. The copper pillar connections provide improved thermal conductivity between the semiconductor die and the internal leadfingers, further supporting heat dissipation of the package.

By undermounting the semiconductor die, overall package thickness may be reduced compared to a conventionally mounted flip-chip die. Alternatively, additional components, such as passive or active components, may be mounted to the top of the internal leadfingers, thereby facilitating further integration within a standard SOT package size.

In one example, a semiconductor package includes a semiconductor die with an active surface and an inactive surface, the active surface including metal pillars providing electrical connections to functional circuitry of the semiconductor die, and a backside metal layer on the inactive surface. The backside metal layer is attached to the inactive surface. The semiconductor package further includes a plurality of leads with each of the leads including an internal leadfinger portion and an exposed portion that includes a bonding portion. Distal ends of the metal pillars are in contact with and electrically coupled to the internal leadfinger portions. The backside metal layer is exposed on an outer surface of the semiconductor package. The bonding portions and the backside metal layer approximately planar to each other.

In another example, a method of forming a package includes positioning metal pillars extending from an active surface of a semiconductor die against internal leadfinger portions of a plurality of leads, the metal pillars providing electrical connections to functional circuitry of the semiconductor die, reflowing the metal pillars so that distal ends of the metal pillars become electrically coupled to the internal leadfinger portions of the plurality of leads, molding a mold compound to cover the internal leadfinger portions of the leads and partially cover the semiconductor die, and locating bonding portions of exposed portions of each of the plurality of leads to be approximately planar with a backside metal layer over an inactive surface of the semiconductor die.

DETAILED DESCRIPTION

Figure 1A:
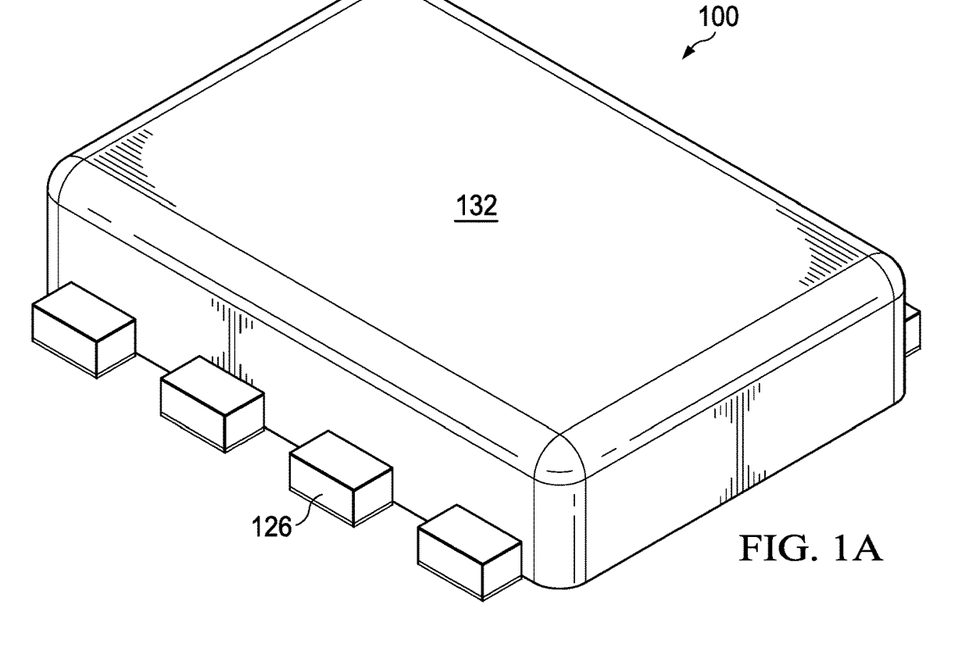
FIGS. 1A-1D illustrate a thin SOT package with an undermounted semiconductor die with exposed backside metal.
Figure 1B:
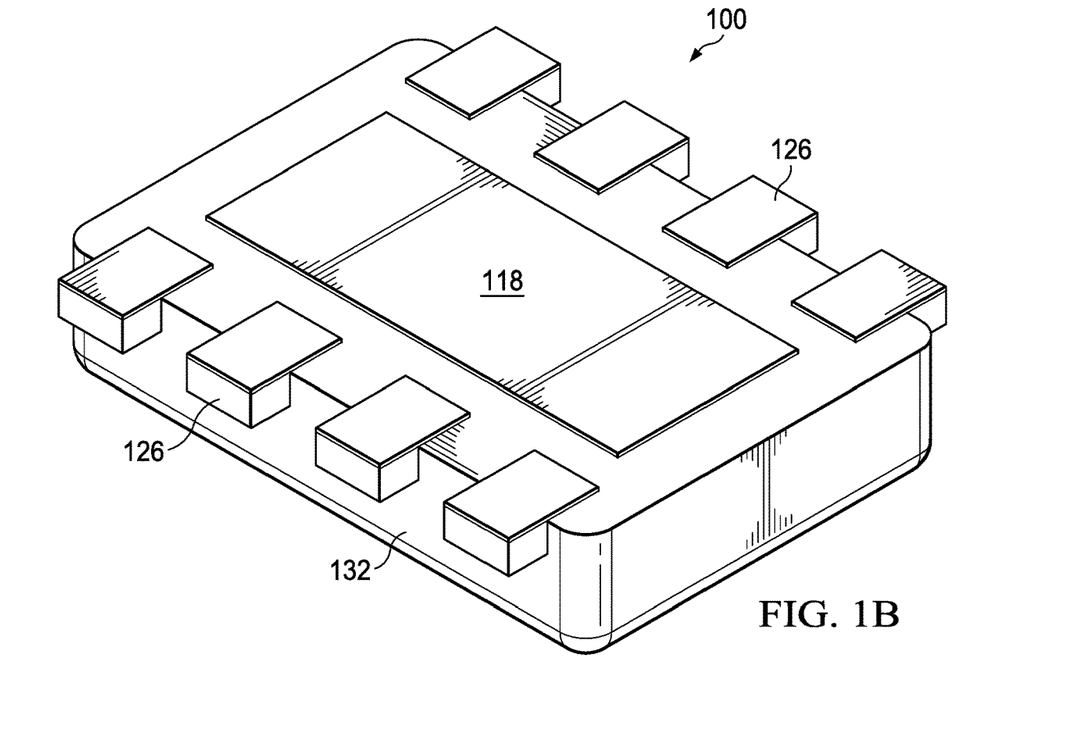
Figure 1C:
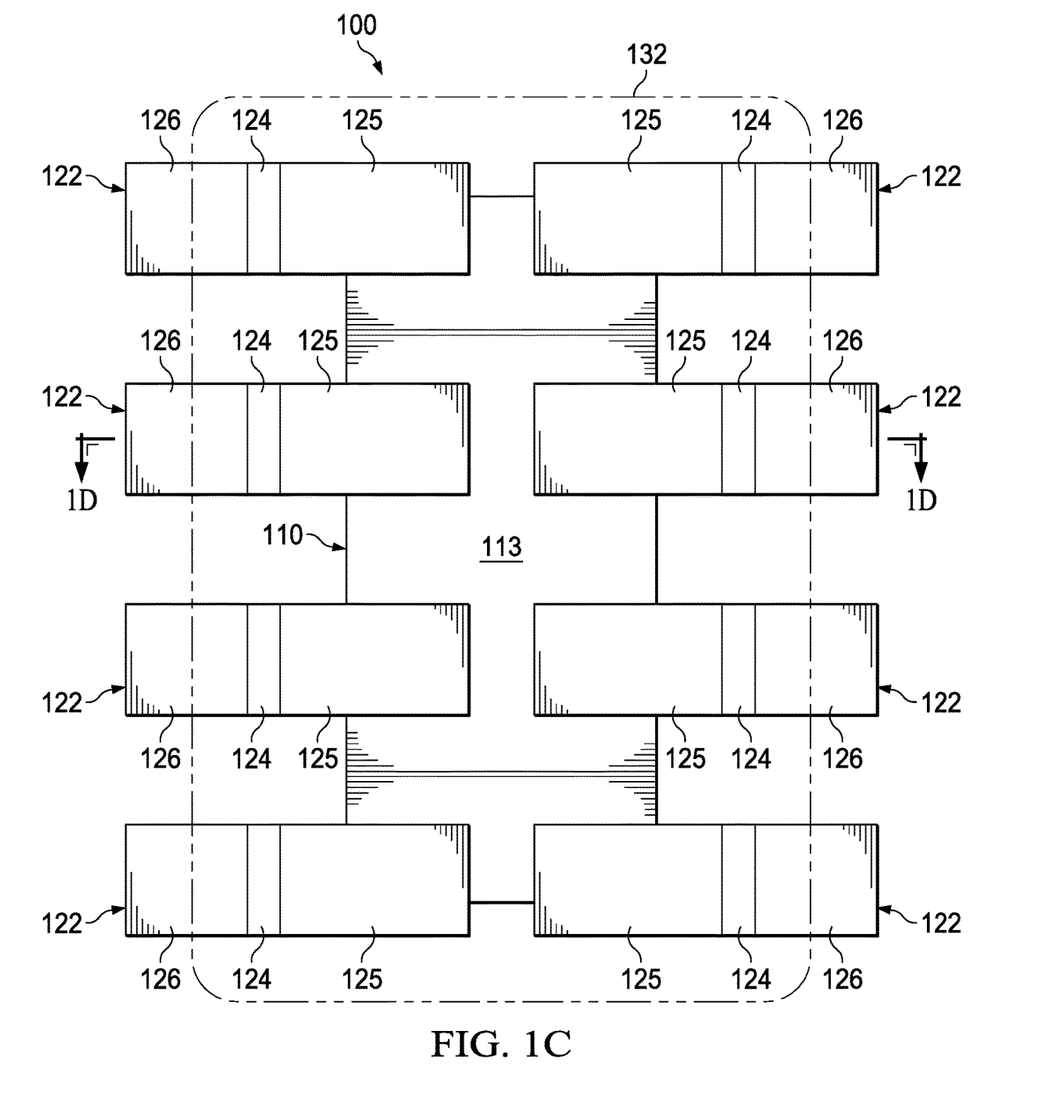
Figure 1D:
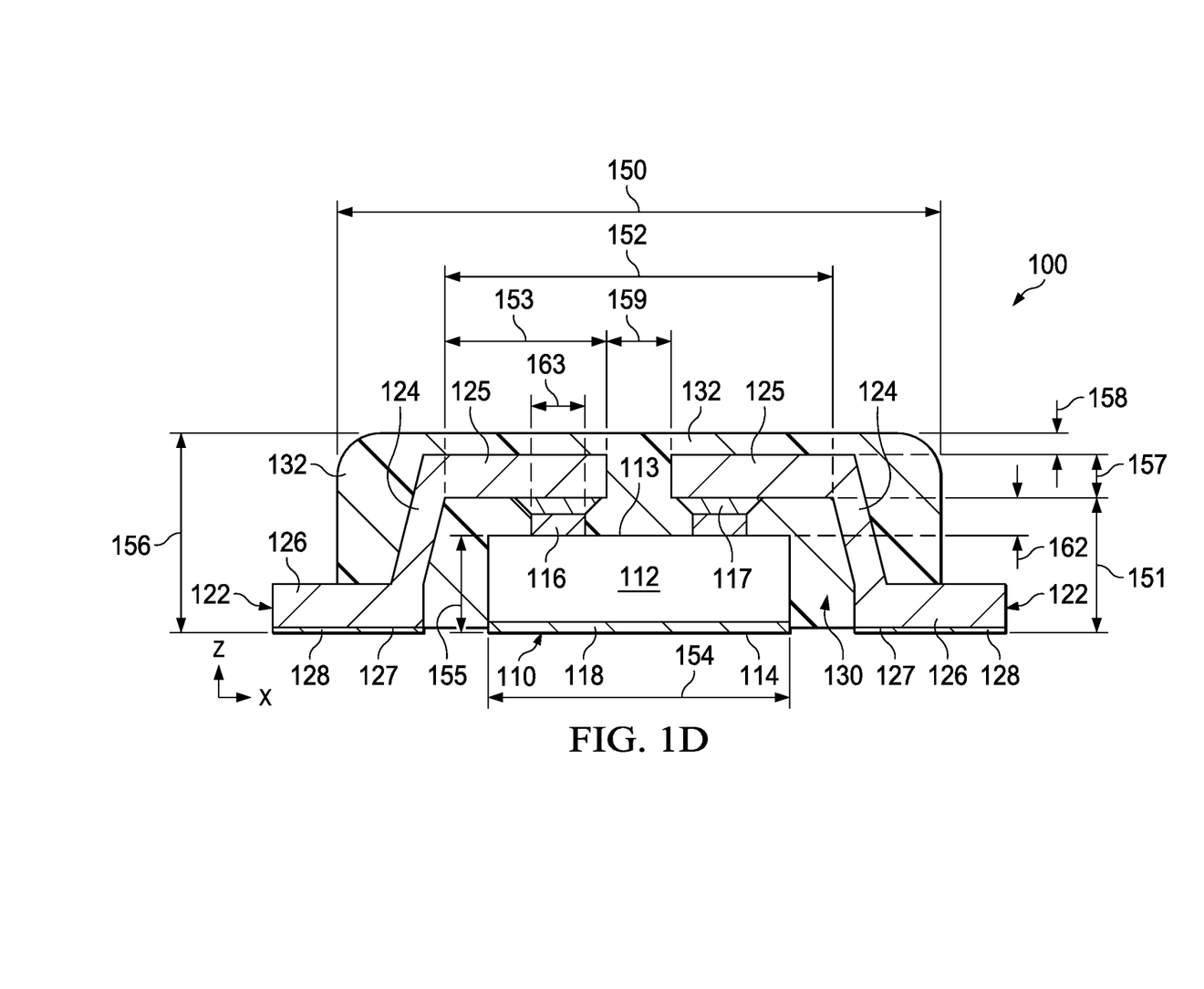

FIGS. 1A-1D illustrate package 100. Specifically, FIGS. 1A and 1B illustrate perspective views of package 100, FIG. 1C illustrates a top view of package 100 with mold compound 132 hidden, and FIG. 1D illustrates a cross-sectional view of package 100.

Package 100 includes leads 122; leads 122 may collectively referred to as the leadframe of package 100. Each of leads 122 includes two bends, separating the lead into three segments: an internal leadfinger 125 providing a mounting surface for both a conventionally mounted and an undermounted flip-chip die or other circuit component, an external foot 126, and a tapered segment 124 between internal leadfinger 125 and external foot 126. The external foot includes an exposed portion including a bonding portion 127 for securing to a substrate. Internal leadfinger 125 and external foot 126 are approximately parallel, while tapered segment 124 is angled at less than 90 degrees relative to internal leadfinger 125 and external foot 126 to facilitate shaping the leadframe by stamping. The underside of leads 122 form a cavity 130 for undermounting of a semiconductor die or other circuit component.

While internal leadfingers 125 include both an upper mounting surface for a conventionally mounted and bottom mounting surface for an undermounted flip-chip die, package 100 only includes an undermounted semiconductor die, semiconductor die 110. In this undermounted configuration, backside metal layer 118 of semiconductor die 110 is exposed in the same plane as bonding portions 127 along a bottom surface of package 100 for direct surface mounting.

Semiconductor die 110 comprises a substrate 112 (e.g., silicon or silicon/germanium) having an active surface 113 including functional circuitry and an inactive surface 114, and at least one backside metal layer 118 on the inactive surface 114 of the substrate 112. The functional circuitry of semiconductor die 110 is formed on a semiconductor wafer prior to singulation of semiconductor die 110 and includes circuit elements such as transistors, diodes, capacitors, and resistors, as well as signal lines and other electrical conductors that interconnect the various circuit elements. As non-limiting examples, such functional circuitry may include an application specific integrated circuit (ASIC), a digital signal processor, a radio frequency chip, a memory, a microcontroller and a system-on-a-chip or a combination thereof. The functional circuitry is generally integrated circuitry that realizes and carries out desired functionality of the package, such as that of a digital IC (e.g., digital signal processor) or analog IC (e.g., amplifier or power converter), such as a BiMOS IC. The capability of functional circuitry may vary, ranging from a simple device to a complex device.

Copper pillars 116 extend from the functional circuitry of semiconductor die 110. Specifically, copper pillars 116 extend through bond pad openings in a dielectric layer of semiconductor die 110 and are bonded to a metallization layer including functional circuitry (not shown) in semiconductor substrate 112. Copper pillars 116 include solder joints 117 electrically connecting copper pillars 116 to the bottom mounting surface of internal leadfinger portions 125 in a flip chip configuration. Solder joints 117 are on top of copper pillars 116. In some examples, solder joints 117 may include a lead-free solder, such as tin or tin-silver alloy, such as tin with 0 to 2.5 percent by weight silver. Copper pillars 116 comprise a copper or copper alloy; however, in other examples, different metal pillars or other conductive pillars may be used. In addition, copper pillars 116 or other metal pillars may be bonded directly to inner leadfingers 125 using a thermo-compression type bond rather than solder joints 117.

For flip chip attachment of semiconductor die 110 to inactive surfaces of internal leadfinger portions 125, semiconductor die 110 is positioned with solder caps 217 (FIG. 2D) in contact with internal leadfinger portions 125. The assembly is heated to reflow solder caps 217 to form solder joints 117, thereby physically and electrically coupling copper pillars 116 with leads 122. In this manner, copper pillars 116 represent the die contacts or bond pads of semiconductor die 110. Other die contacts may also be used, such as solder balls. However, compared to solder balls, copper pillars 116 can provide improved thermal conductivity between leads 122 and semiconductor die 110, thereby facilitating improved heat dissipation for package 100.

Backside metal layer 118 is directly attached to the inactive surface 114 of the substrate 112 of semiconductor die 110. As used herein "directly attached" refers to a connection that does not include any intervening layers.

An area of the backside metal layer 118 matches an area of the inactive surface 114 of semiconductor die 110. In some examples, backside metal layer 118 matching an area of the inactive surface 114 of semiconductor die 110 is provided by metal plating an exposed surface of inactive surface 114 of substrate 112. Such plating may cover exposed bonding portions 127 of feet 126 simultaneously with inactive surface 114 of substrate 112. In such examples, plating layers 128 of feet 126 include the same metal(s) as backside metal layer 118.

In other examples, backside metal layer 118 matching an area of the inactive surface 114 of semiconductor die 110 is provided by the backside metal layer 118 being on the inactive surface 114 of semiconductor die 110 before singulation (e.g., backside metal layer 118 is deposited on the inactive surface 114 of the substrate 112 while semiconductor die 110 is in wafer form), so that the singulation process cuts the wafer into a plurality of semiconductor die each having an area that is constant during the cutting process through both the backside metal layer 118 and the substrate 112.

A variety of backside metal layers 118 can be used. Backside metal layers 118 provide adhesion to Si, barriers to undesired diffusion and a solder wettable outer surface. In one example, the backside metal layer 118 is an adhesion/barrier layer plus a single metal layer, such as copper. The thickness of the copper layer is typically 3 µm to 6 µm, but can be thinner or thicker than this range. One example process involves forming a thin seed layer before forming the copper layer. In another example, the backside metal layer comprises a first metal layer on the inactive surface 114 of semiconductor die 110 and a multi-layer metal stack comprising at least a second metal layer different from the first metal layer on the first metal layer. For example, the first metal layer can comprise titanium. Titanium is known to provide good adhesion with silicon and other semiconductors and thereby to create an effective "adhesion layer". Other examples may comprise tantalum, palladium, vanadium or molybdenum as the first layer in contact with the inactive surface 114 of semiconductor die 110. Like titanium, these metals provide good adhesion to silicon because they can form intermediate metal-silicides with silicon at relatively low temperatures. Some examples of specific multi-layer backside metal stacks include Cu on Ti, Ag on Ti, Cu on Ti, and stacks including first, second and third metal layers, such as Au on Ni on Ti, and Ag on Ni on Ti. A nickel layer can provide protection for underlying metal layers from mechanical scratching and corrosion.

In other examples, the second metal layer includes nickel. For example, Ag on Ni on Ti, or Pd on Ni on Ti. Titanium can act as a barrier layer to stop metal diffusion into the substrate, provides a stress buffer layer, and also act to prevent fracturing inside the metal stack due to its high fracture strength. Typical thicknesses for the multi-layer metal stack can comprise 1 to 2 kÅ for the first metal layer, 2 to 4 kÅ for the second metal layer and 10 to 20 kÅ for the third metal layer. In the case of Au for the third metal layer, the Au thickness can be significantly thicker than 20 kÅ.

However, the respective metal layer thicknesses can be thinner or thicker than these ranges.

Leadframes, such as the leadframe including leads 122, are formed on a single, thin sheet of metal as by stamping or etching. Multiple interconnected leadframes may be formed on a single leadframe sheet, the interconnected leadframes referred to as a leadframe strip. Leadframes on the sheet can be arranged in rows and columns. Tie bars connect leads and other elements of a leadframe to one another as well as to elements of adjacent leadframes in a leadframe strip. A siderail may surround the array of leadframes to provide rigidity and support leadframe elements on the perimeter of the leadframe strip. The siderail may also include alignment features to aid in manufacturing.

Usually die mounting, die to lead attachment, such as solder reflowing or wire bonding, and molding to cover at least part of the leadframe and dies take place while the leadframes are still integrally connected as a leadframe strip. After such processes are completed, the leadframes, and sometimes mold compound of a package, are severed ("singulated" or "diced") with a cutting tool, such as a saw or laser. These singulation cuts separate the leadframe strip into separate IC packages, each IC package including a singulated leadframe, at least one die, electrical connections between the die and leadframe (such as gold or copper bond wires) and the mold compound which covers at least part of these structures.

Tie bars and siderails may be removed during singulation of the packages. The term leadframe represents the portions of the leadframe strip remaining within a package after singulation. With respect to package 100, its leadframe includes leads 122 although those elements are not interconnected following singulation of package 100.

Leads 122 form a leadframe upset providing cavity 130. Cavity 130 is of a depth such that backside metal layer 118 is at least approximately coplanar relative to bonding portions 127 of leads 122. As used herein, the term approximately is used to mean functionally equivalent to a precise arrangement. For example, with respect to bonding portions 127 and backside metal layer 118, misalignment that does not negatively affect physical, electrical, or thermal attachment to a substrate is considered to be within the definition of approximately coplanar.

The configuration of leads 122 and die 110 may vary in other examples. For example, leads 122 may form a deeper recess such that die 110 is recessed relative to feet 126. In such example, a metal plating layer may be added to backside metal layer 118 to build-up backside metal layer 118 such that backside metal layer 118 is approximately coplanar relative to bonding portions 127 of leads 122.

Mold compound 132 provides a protective layer covering electronics of package 100, including die 110, copper pillars 116, and internal leadfinger portions 125 of leads 122. Portions of leads 122 covered by mold compound 132 include the two bends separating internal leadfingers 125, tapered segment 124, and external feet 126.

In the example shown, external feet 126 of leads 122 are approximately coplanar with backside metal layer 118 of die 110. Such a configuration facilitates supporting leads 122 and die 110 on a flat surface during the molding process. Likewise, mold compound 132 surrounding backside metal layer 118 is approximately planar to backside metal layer 118 and bonding portions 127 of feet 126.

Mold compound 132 may be formed from a nonconductive plastic or resin material. In some examples, mold compound 132 is molded over the electronics of package 100 in a molding process such as a transfer molding process or compression molding process. Mold compounds suitable for use as mold compound 132 include, for example, thermoset compounds that include an epoxy novolac resin or similar material combined with a filler, such as alumina, and other materials to make the compound suitable for molding, such as accelerators, curing agents, filters, and mold release agents.

Mold compound 132 only partially covers die 110, leaving backside metal layer 118 of die 110 flush with mold compound 132 on the surface of package 100. While mold compound 132 may be selected to facilitate heat dissipation during the operation of package 100, the exposed surface of backside metal layer 118 further facilitates heat dissipation by allowing direct contact between die 110 and air or a heat sink.

Backside metal layer 118 allows package 100 to be directly soldered to a package substrate, such as a PCB. Directly soldering the backside metal layer 118 of package 100 to a package substrate provides good thermal transfer from semiconductor die 110 to the package substrate. In this directly soldered arrangement, the thermal dissipation path has a minimum number of interfaces, including from the functional circuitry on active surface 113 of semiconductor die 110 through the thickness of the substrate 112 and a tiny contribution across the backside metal layer 118, so that thermal dissipation for package 100 to the underlying workpiece is generally set by the thermal conductivity of the substrate 112 for semiconductor die 110 or about 140 W/m·K for a silicon substrate. In various examples, semiconductor die 110 is a thinned die, such as 40 to 200 μm in thickness, to further enhance thermal transfer from the packaged semiconductor device to the workpiece, and facilitate undermounting semiconductor die 110 within cavity 130.

In addition, direct solderability provided by package 100 reduces assembly cost as compared to conventional assembly, such as by eliminating the need for thermal grease and heat sinks, and added processing, such as attachment to a heat sink. Moreover, direct soldering reduces board space for PCB assemblies, and eases PCB layout by enabling use of surface mount device (SMD) rules for SOT packages.

Package 100 conforms to a standard SOT package, albeit with a thinner profile as described herein. SOT packages conform to standard surface mount sizes commonly used in consumer electronics. While originally utilized for discrete surface mount transistors, such packages may include semiconductor dies with a variety of integrated circuits. As disclosed herein with respect to packages 300, 400, 500, 600, SOT packages may further incorporate a number of components, both passive and active, in addition to an undermounted semiconductor die.

A chart of example SOT packages and basic body dimensions is shown below in TABLE 1. Unless noted as leadless, surface mount leads of each package extend beyond the body dimensions shown in the TABLE 1. The following table is shown for context, and there are other variations of SOT packages and further may be developed. For example, thin small outline transistor (TSOT) packages have reduced maximum heights compared to the standard SOT package dimensions shown in the TABLE 1.

TABLE 1

SOT STANDARD DIMENSIONS

| Package | Length (mm) | Width (mm) | Max Height (mm) | Terminals |
| --- | --- | --- | --- | --- |
| SOT23-3 | 2.92 | 1.3 | 1.12 | 3 |
| SOT-89 | 4.5 | 2.5 | 1.5 | 4 |

TABLE 1-continued

SOT STANDARD DIMENSIONS

| Package | Length (mm) | Width (mm) | Max Height (mm) | Terminals |
|---|---|---|---|---|
| SOT-143 | 2.9 | 1.3 | 1.22 | 4 |
| SOT-223 | 6.5 | 3.5 | 1.8 | 4 |
| SOT-323 | 2 | 1.25 | 1.1 | 3 |
| SOT-416 | 1.6 | 0.8 | 0.9 | 3 |
| SOT-663 | 1.6 | 1.2 | 0.6 | 3 |
| SOT-723 | 1.2 | 0.8 | 0.55 | 3, flat |
| SOT-883 | 1 | 0.6 | 0.5 | 3, leadless |
| SOT23-6 | 2.9 | 1.3 | 1.3 | 6 |
| SOT-353 | 2 | 1.25 | 0.95 | 5 |
| SOT-363 | 2 | 1.25 | 0.95 | 6 |
| SOT-563 | 1.6 | 1.2 | 0.6 | 6 |
| SOT-665 | 1.6 | 1.6 | 0.55 | 5 |
| SOT-666 | 1.6 | 1.2 | 0.6 | 6 |
| SOT-886 | 1.45 | 1 | 0.5 | 6, leadless |
| SOT-891 | 1 | 1 | 0.5 | 5, leadless |
| SOT-953 | 1 | 0.8 | 0.5 | 5 |
| SOT-963 | 1 | 1 | 0.5 | 6 |
| SOT-1115 | 1 | 0.9 | 0.35 | 6, leadless |
| SOT-1202 | 1 | 1 | 0.35 | 6, leadless |

While the techniques of this disclosure may be applied to other packages, the relatively small dimensions of SOT packages provide significant challenges for undermounting semiconductor dies. Undermounting a semiconductor die includes positioning a die within a cavity of a leadframe upset on the same side of the leadframe as the lead bonding areas. This leadframe upset includes tapered sides as the leadframe is cut from a flat stock material before shaping in a press or stamp. For a given set of package dimensions, the tapered sides of the leadframe upset mean there is less real estate to position an undermounted semiconductor die as compared to a semiconductor die conventionally mounted on top of the leadframe upset. While the electrical contacts of a conventionally mounted component much be adjacent to the bonding area on the upper surface of the leadframe upset, the component itself extends beyond the bonding area so long as it remains inside the boundaries of the package mold component. In contrast, any undermounted component must fit within the cavity formed by the upset.

Limiting the depth of the leadframe upset allows more space in the X direction by reducing the width occupied by the tapered portions of the leadframe upset. However, with a shorter depth for the leadframe upset, a thinner semiconductor die is required to fit within the cavity of the leadframe upset. For a given integrated circuit design, a thinner semiconductor die will generally be more fragile and subject to warpage than a thicker semiconductor die.

FIG. 1D includes notations for a number of dimensions defining example configurations of packages disclosed herein in the X-Z plane. For reference, backside metal layer 118 is exposed on an X-Y surface of package 100, and leads 122 form two rows of leads extending in a Y dimension of the X-Y surface.

Package width 150 represents the overall width of molding material as defined by the corresponding SOT standard.

Upset height 151 represents the height of cavity 130 formed by the leadframe upset as described herein.

Upset width 152 represents the overall width of internal leadfingers portions 125, providing the overall bondable width of the bottom mounting surface of internal leadfingers portions 125 and topside die attach areas (the topside area is not utilized in package 100).

Bondable area 153 is the length of a single internal leadfinger portion 125 within the upset width 152. Bondable area 153 represents the total distance available for mounting on a single lead, although some clearance may be needed between an undermounted component within cavity 130 and the tapered portions of internal leadfinger portions 125.

Gap 159 separates the bondable areas 153 of adjacent leads in the X direction, gap 159 may be selected to ensure isolation between internal leadfingers portions 125, such as between about 50 μm and 500 μm such as about 125 μm.

Die width 154 is the maximum width of a die within cavity 130. Die width 154 is less than upset width 152 to provide clearance and electrical isolation between the tapered portions of leads 122 and semiconductor die 110.

Copper pillars 116 and solder joints 117 provide a gap 162 between active surface 113 of semiconductor die 110 and the bottom mounting portion of leadfingers portions 125. Copper pillar widths 163 represent the thicknesses of copper pillars 116 in the X dimension, such as between about 25 μm and 400 μm such as about 100 μm. Such thickness may be selected to provide low electrical resistance between die 110 and leadfingers portions 125 as well as support thermal conductivity between die 110 and leadfingers portions 125. The thickness of copper pillars 116 in the Y dimension may be similar to copper pillar widths 163 in the X dimension, such as between about 25 μm and 400 μm such as about 100 μm. The maximum size of copper pillars 116 in the X and Y dimensions is limited by a need for electrical isolation between copper pillars 116 and available space on the bottom mounting portions of leadfingers portions 125.

Upset height 151 is the height of cavity 130 in the Z dimension. Backgrind thickness 155 represents the maximum die height to allow semiconductor die 110 to fit within cavity 130 with backside metal layer 118 about parallel to bonding portions 127 of leads 122.

Package thickness 156 represents the minimum package thickness for an SOT package relative to the other selected dimensions. Included in package thickness 156 is upset height 151, leadframe thickness 157, and a minimum thickness 158 for mold compound 132 over internal leadfingers portions 125.

Mold compound thickness 158 varies according to materials, current and other the parameters of package 100; examples for mold compound thickness 158 include between about 25 μm and 150 μm, such as about 50 μm.

Leadframe thickness 157 corresponds a thickness of a material used to form leads 122 prior to bending; examples for leadframe thickness 157 include between about 50 μm and 500 μm such as about 125 μm.

In some particular examples, in accordance with a variety of SOT standard dimensions, a length of mold compound 132 in the Y dimension is between about 1 millimeter (mm) and about 6.5 mm, such as between about 2.8 mm and about 3 mm. In the same or different examples, the width 150 of mold compound 132 in an X dimension of the X-Y surface is between about 0.6 mm and about 3.5 mm, such as between about 1.2 mm and about 1.4 mm. In the same or different examples, the thickness 156 of mold compound 132 in a Z dimension generally perpendicular to the X-Y surface is between about 0.2 mm and about 1.8 mm, such as between about 0.3 mm and about 0.4 mm. However, in examples in which a second component is topside mounted on internal leadfinger portions 125 of leads 122, such as with packages 300, 400, 500, 600, a height of mold compound in the Z dimension may be greater, such as between about 0.5 mm and about 1.3 mm.

Table 2 lists four leadframe upset dimensions for implementation within an SOT23-6 package. These example dimensions are equally applicable to any package with a width of 1.3 mm. For example, as represented by Example 1 of Table 2, a leadframe upset of 150 µm allows for a maximum die width of 0.923 mm, a reduction compared to the upset length of 0.938 mm, which represents a width of the bonding area for a conventionally mounted die or other component. The larger leadframe upsets of examples 2-4 allow progressively smaller maximum die widths.

TABLE 2

EXAMPLE DIMENSIONS

| SOT23-6 Examples | Upset 151 (µm) | Upset width 152 (mm) | Bondable area 153, per lead in X direction (mm) | Max die width 154 (mm) | Backgrind thickness 155 (µm, mil) | Package Thickness 156 (undermount) |
|---|---|---|---|---|---|---|
| 1 | 150 | 0.938 | 0.419 | 0.923 | 76, 3 | 0.325 |
| 2 | 175 | 0.909 | 0.405 | 0.894 | 101, 4 | 0.350 |
| 3 | 200 | 0.880 | 0.390 | 0.865 | 127, 5 | 0.375 |
| 4 | 225 | 0.851 | 0.376 | 0.836 | 152, 6 | 0.400 |

FIGS. 2A-2H illustrate cross-sectional views of conceptual process steps for manufacturing semiconductor package 100. FIG. 3 is flowchart of a method of manufacturing a thin SOT package with an undermounted semiconductor die with exposed backside metal. For clarity, the techniques of FIG. 3 are described with respect to package 100 and FIGS. 1A-1D; however, the described techniques may also be readily adapted to alternative package configurations, including packages 300, 400, 500, 600 as described with respect to FIGS. 4A-7.

Figure 2A:
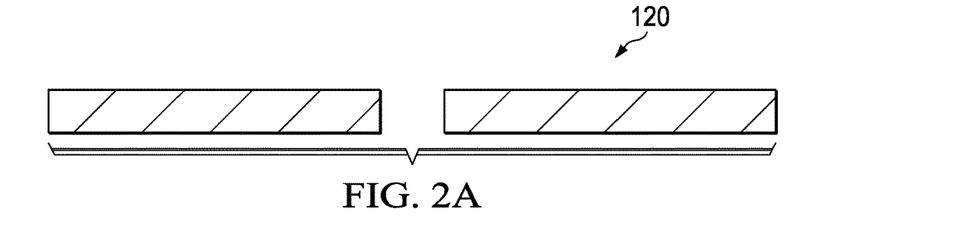
FIGS. 2A-2H illustrate conceptual process steps for manufacturing the package of FIGS. 1A-1D.
Figure 3:
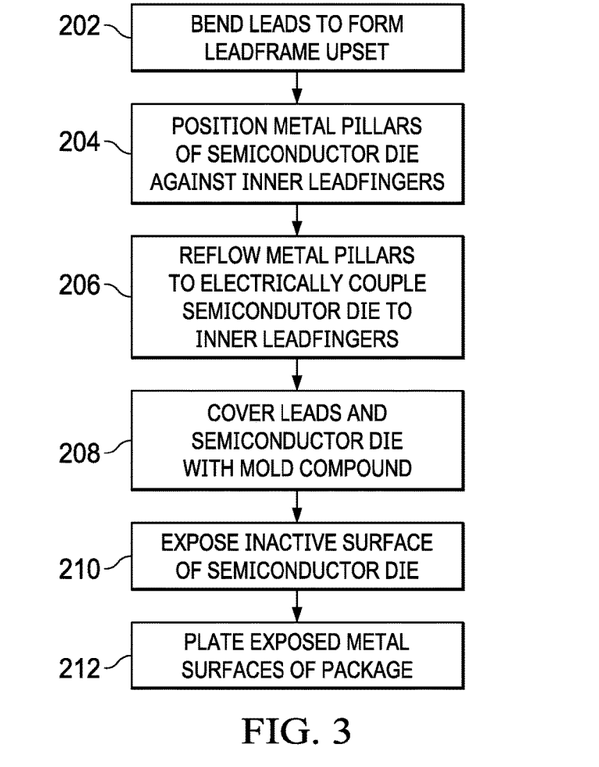
FIG. 3 is flowchart of a method of manufacturing a thin SOT package with an undermounted semiconductor die with exposed backside metal, such as the package of FIGS. 1A-1D.

FIG. 2A illustrates a leadframe 120 cut from a single, thin sheet of metal as by stamping or etching and prior to bending to shape leads 122. Leadframe 120 is associated with a single package, but may be one of a plurality of leadframes arranged on a leadframe sheet as described previously.

Figure 2B:
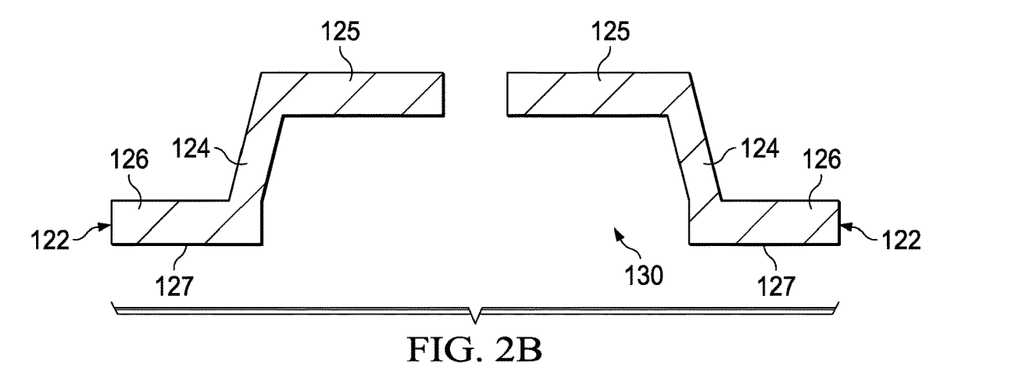

As represented by FIG. 2B, leadframe 120 is bent to form the leadframe upset with leads 122, such as by stamping an entire leadframe sheet (step 202). Following the bending, each of leads 122 includes an internal leadfinger portion 125, tapered portions, and external feet 126 with bonding portions 127. The bent leads 122 combine to form a leadframe upset providing a cavity 130 for undermounting of semiconductor die 110. The thickness of semiconductor die 110 is selected to match cavity 130 such that bonding portions 127 of leads 122 are approximately planar with inactive surface 114, which may include backside metal layer 118.

Figure 2C:
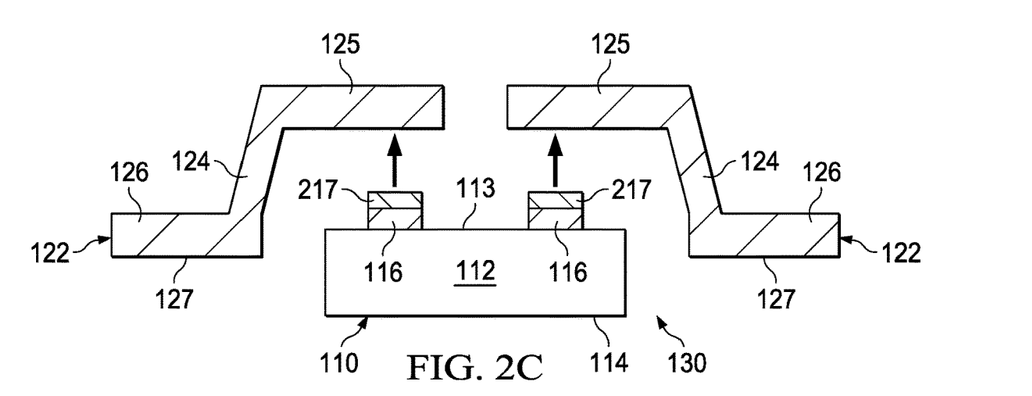
Figure 2D:
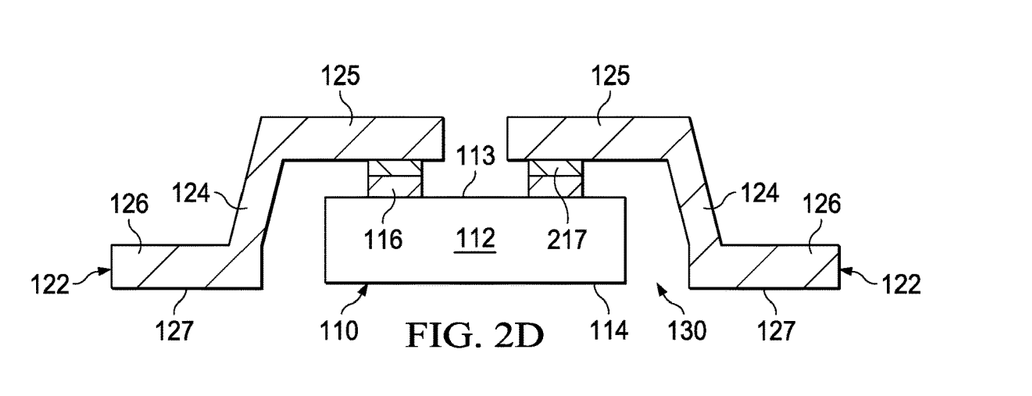

As represented by FIGS. 2C and 2D, semiconductor die 110 is positioned with cavity 130. Specifically, copper pillars 116 with solder caps 217 extending from active surface 114 of semiconductor die 110, are positioned against internal leadfinger portions 125 of leads 122 (step 204). Inactive surface 114 of semiconductor die 110 may be located to be approximately planar with bonding portions 127 or partially recessed relative to bonding portions 127 to receive metal plating.

Figure 2E:
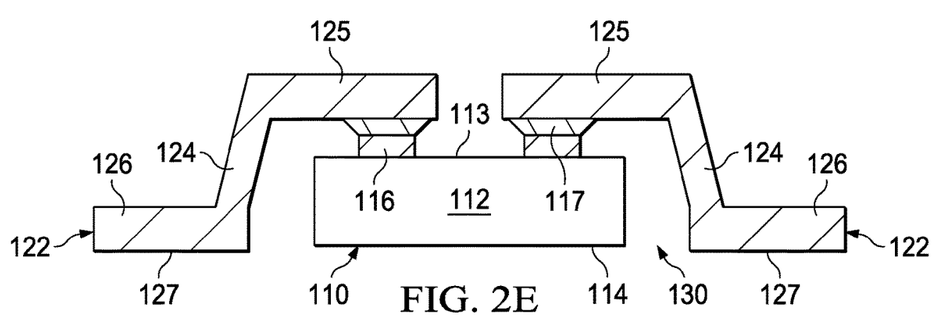

As shown in FIG. 2E, copper pillars 116 are reflowed to electrically couple the distal ends of copper pillars 116 to internal leadfinger portions 125 of leads 122 (step 206). Specifically, solder caps 217 are melted while in contact with internal leadfinger portions 125 to form solder joints 117. In other examples, copper pillars 116 or other metal pillars may be bonded directly to inner leadfingers 125 using a thermo-compression type bond rather than reflowing solder caps 217 to form solder joints 117.

Figure 2F:
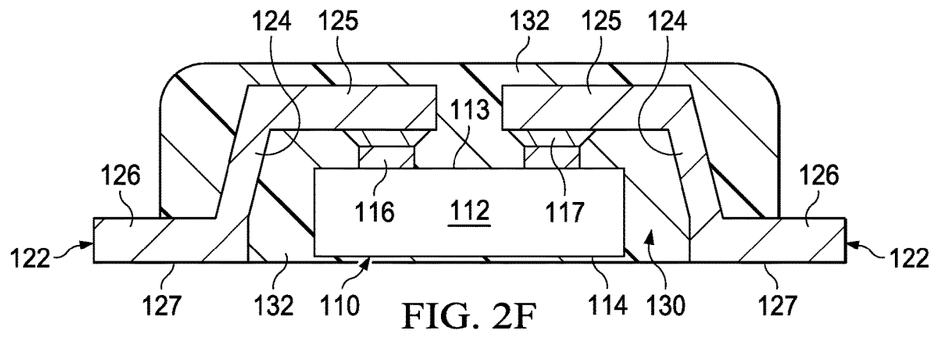

As shown in FIG. 2F, mold compound 132 is molded to cover internal leadfinger portions 125 of leads 122 and partially cover semiconductor die 110 (step 208). In some examples, tape (not shown) may be applied to shield inactive surface 114 of semiconductor die 110 from mold compound 132 prior to molding. In the same or different examples, a passive component or second semiconductor die may be mounted to internal leadfinger portions 125 opposite semiconductor die 110 prior to the molding. Such examples are described with respect to packages 300, 400, 500, 600 as illustrated in FIGS. 4A-7.

Figure 2G:
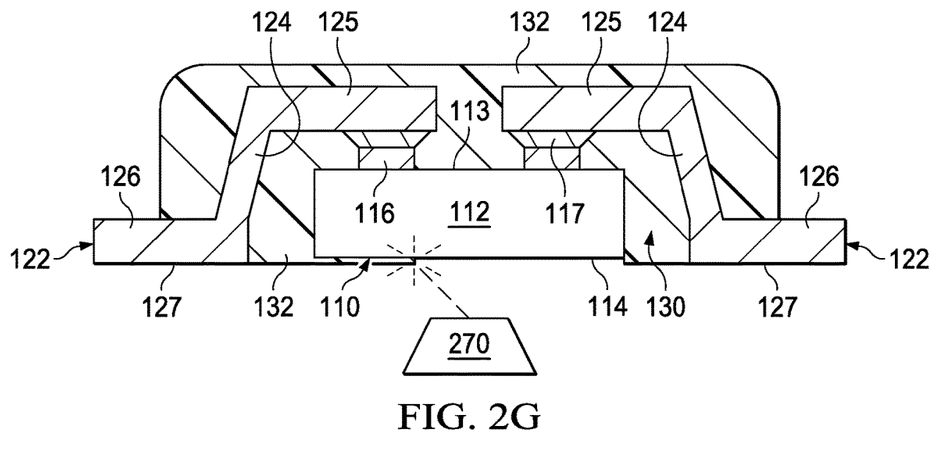

As represented by FIG. 2G, inactive surface 114 of semiconductor die 110 is exposed. In examples in which a tape is applied to inactive surface 114 prior to molding, exposing inactive surface 114 of semiconductor die 110 includes removing the tape. In other examples, a laser 270 may be used to ablate mold compound 132 covering inactive surface 114 and expose the inactive surface 114 on an external surface of the package (step 210). Exposing inactive surface 114 from the molded portion of the package enables direct attachment to a substrate, such as a PCB; thereby improving thermal conduction from semiconductor die 110 to the substrate.

Figure 2H:
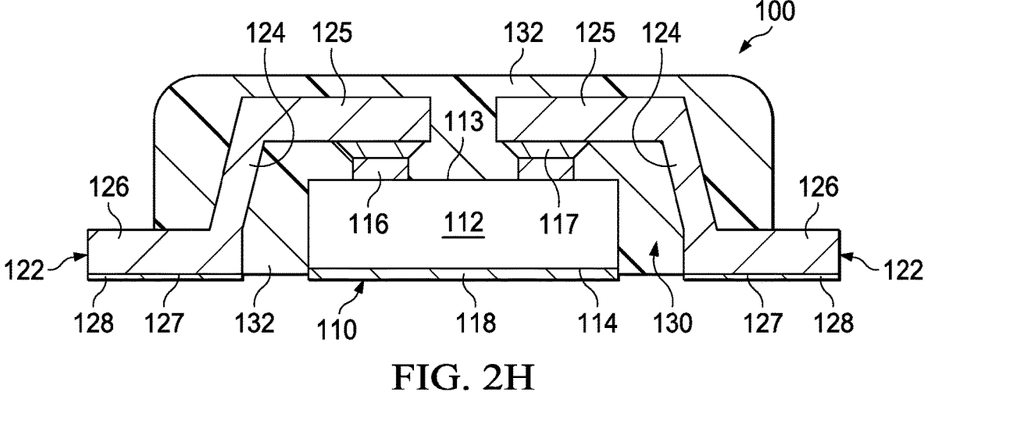

As represented by FIG. 2H, in some examples, exposed metal of package 100, including the backside metal layer 118 on inactive surface 114 and a plating layer 128 on feet 126, is post-plated to provide a readily solderable surface (step 212). Such a common post plating step helps ensure that bonding portions 127 of leads 122 are approximately planar with backside metal layer 118. In other examples, the plating step may be skipped. In such examples, leadframe 120 should be preplated and backside metal layer 118 may be applied prior to singulation of semiconductor die 110 from a silicon wafer. Even with the post-plating set, a preplated leadframe may be used, and inactive surface 114 may also include a backside metal layer such that the post plating covers these preexisting metal layers.

In some examples, package 100 may be one of an array of packages manufactured on an array of interconnected leadframes. In such examples, the method further includes singulating the array of molded packages to form individual packages 100. Singulation may include cutting through any tie bars linking the interconnected leadframes with a saw or other cutting implement.

Figure 4A:
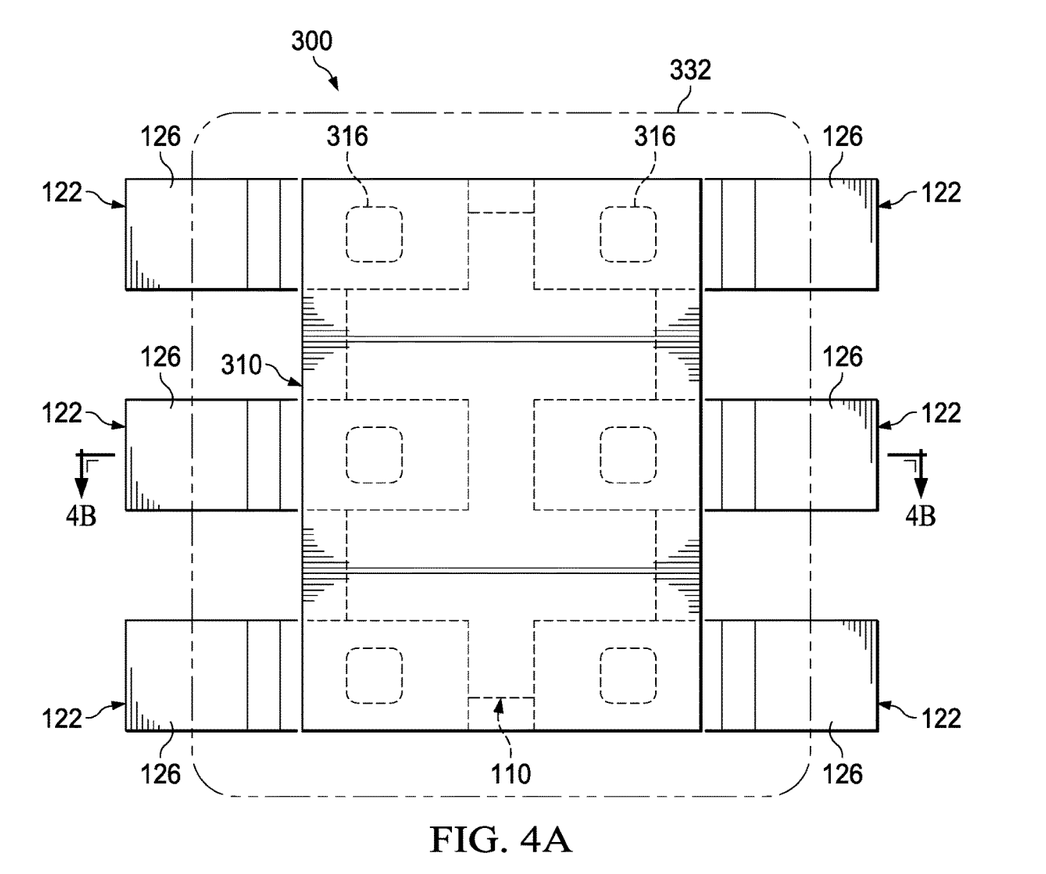
FIGS. 4A and 4B illustrate a package with topside flip chip mounted semiconductor die and an undermounted semiconductor die within a standard SOT package size.
Figure 4B:
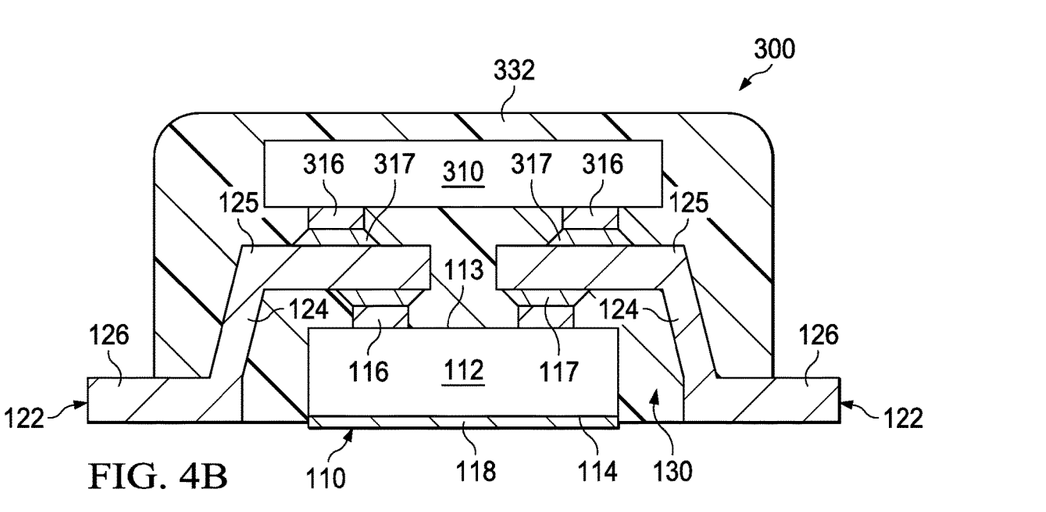

FIG. 4A shows a top view of semiconductor package 300, and FIG. 4B illustrates a cross-sectional view of package 300. Like package 100, package 300 conforms to a standard SOT package size and includes semiconductor die 110 undermounted on leads 122 within cavity 130. In addition to the components of package 100, package 300 further includes a second semiconductor die 310 mounted to internal leadfingers portions 125 opposite semiconductor die 110.

Package 300 is substantially similar to semiconductor package 100 with the addition of semiconductor die 310 and mold compound 332 replacing mold compound 132. Elements of package 300 with the same numbers as package 100 are the same or substantially similar to those elements in package 100. For brevity, such elements are described in limited or no detail with respect to package 300.

Semiconductor die 310 is mounted to internal leadfingers portions 125 opposite semiconductor die 110. Specifically, semiconductor die 310 includes copper pillars 316 extending from an active surface of semiconductor die 310. Semiconductor die 310 is electrically coupled to internal leadfinger portions 125 via copper pillars 316 and solder joints 317. In a variation of package 300, one or more passive components, such as resistors, capacitors, diodes, or other passive components, may replace semiconductor die 310 within package 300. Like semiconductor die 310, such passive components may be electrically coupled to internal leadfinger portions 125 with solder connections.

As shown in FIG. 4A, semiconductor die 310 may have a larger profile in the X-Y plane than semiconductor die 110, as semiconductor die 310 merely needs to fit within the length and width of mold compound 332 of package 300, rather than within cavity 130. However, both semiconductor die 110 and semiconductor die 310 may provide relative thin profiles in order to fit within the height of a standard SOT package.

Mold compound 332 may have a greater height than mold compound 132 in order to cover semiconductor die 310. In other aspects, mold compound 332 is the same as mold compound 132. In this manner, package 100 may provide a thinner version of a standard SOT package, whereas package 300 is typically limited to the maximum height of a standard SOT package.

Figure 5:
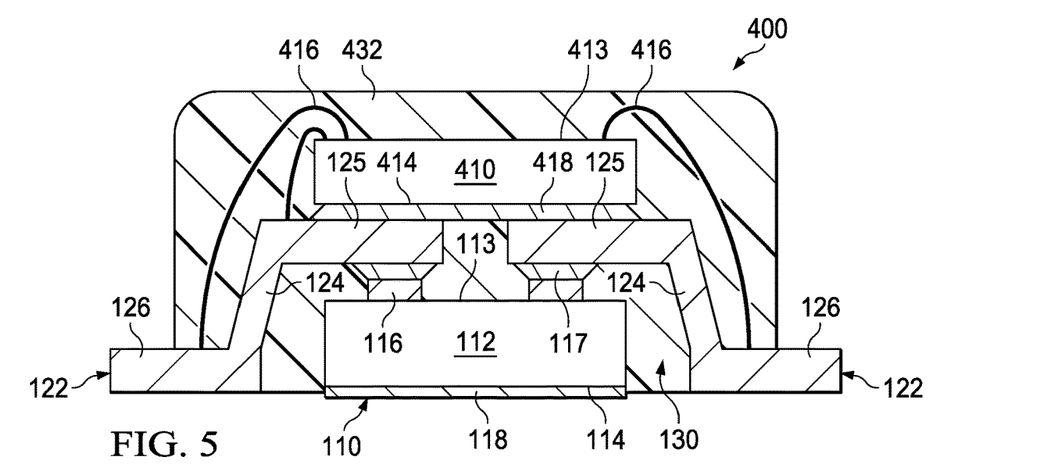
FIG. 5 illustrates a package with topside wire bonded semiconductor die and an undermounted semiconductor die with exposed backside metal within a standard SOT package size.

FIG. 5 illustrates a cross-sectional view of package 400. Like package 100, package 400 conforms to a standard SOT package size and includes semiconductor die 110 under-mounted on leads 122 within cavity 130. In addition to the components of package 100, package 400 further includes a second semiconductor die 410 mounted to internal leadfingers portions 125 opposite semiconductor die 110 with topside wire bonds 416 electrically connecting semiconductor die 410 to leads 122.

Package 400 is substantially similar to semiconductor package 100 with the addition of semiconductor die 410 and mold compound 432 replacing mold compound 132. Elements of package 400 with the same numbers as package 100 are the same or substantially similar to those elements in package 100. For brevity, such elements are described in limited or no detail with respect to package 400.

Wire bonds 416 electrically couple bond pads on active surface 413 of semiconductor die 410 to leads 122. Die attach 418 secures inactive surface 414 of die 410 to the opposite surface of internal leadfinger portions 125 relative to die 110. Die attach 418 is a nonconductive die attach material, such as a nonconductive die attach paste. Die attach 418 also serves as underfill for die 110. Die attach 418 applied opposite die 110 flows around leads 122 to fill the space between internal leadfinger portions 125 and die 410.

As with package 300, semiconductor die 410 may have a larger profile in the X-Y plane than semiconductor die 110, as semiconductor die 410 merely needs to fit within the length and width of mold compound 432 of package 400, rather than within cavity 130. However, both semiconductor die 110 and semiconductor die 410 may provide relative thin profiles in order to fit within the height of a standard SOT package.

Mold compound 432 may have a greater height than mold compound 132 in order to cover semiconductor die 410 and wire bonds 416. In other aspects, mold compound 432 is the same as mold compound 132. In this manner, package 100 may provide a thinner version of a standard SOT package, whereas package 400 is typically limited to the maximum height of a standard SOT package.

Figure 6:
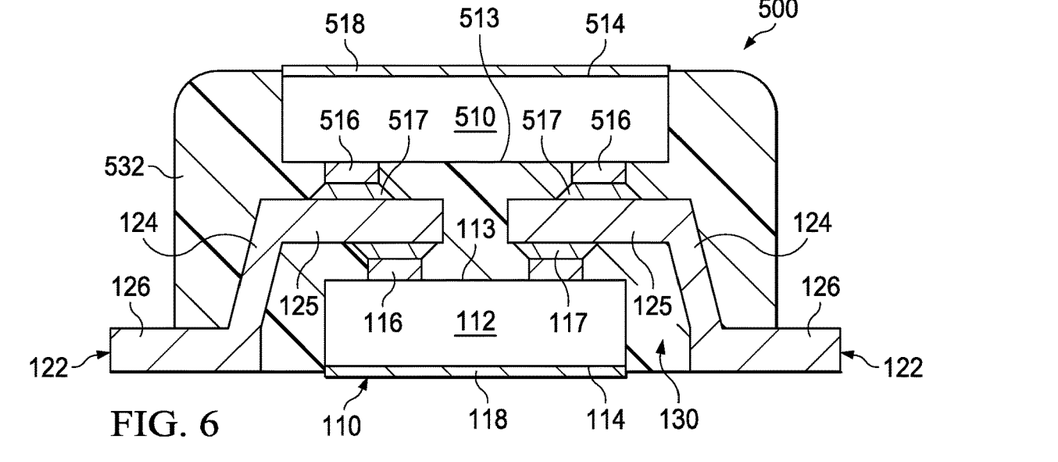
FIG. 6 illustrates a package with topside semiconductor die including an exposed backside metal facilitating conductive cooling and an undermounted semiconductor die with exposed backside metal within a standard SOT package size.

FIG. 6 illustrates a cross-sectional view of package 500. Like package 100, package 500 conforms to a standard SOT package size and includes semiconductor die 110 under-mounted on leads 122 within cavity 130. In addition to the components of package 100, package 500 further includes a second semiconductor die 510 mounted to internal leadfingers portions 125 opposite semiconductor die 110 with backside metal layer 518 of semiconductor die 510 exposed on an outer surface of package 500.

Semiconductor die 510 comprises a substrate (e.g., silicon or silicon/germanium) having an active surface 513 including functional circuitry and an inactive surface 514, and at least one backside metal layer 518 on the inactive surface 514 of the substrate. Copper pillars 516 extend from the functional circuitry of semiconductor die 510. Specifically, copper pillars 516 extend through bond pad openings in a dielectric layer of semiconductor die 510 and are bonded to a metallization layer including functional circuitry (not shown) in the semiconductor layer.

Semiconductor die 510 mounted to internal leadfingers portions 125 opposite semiconductor die 110. Specifically, semiconductor die 510 includes copper pillars 516 extending from an active surface 513 of semiconductor die 510. Semiconductor die 510 is electrically coupled to internal leadfinger portions 125 via copper pillars 516 and solder joints 517. In a variation of package 500, one or more passive components, such as resistors, capacitors, diodes, or other passive components, may replace semiconductor die 510 within package 500. Like semiconductor die 510, such passive components may be electrically coupled to internal leadfinger portions 125 with solder connections.

Backside metal layer 518 is directly attached to the inactive surface 514 of the substrate of semiconductor die 510. Backside metal layer 518 may be exposed as described with respect to backside metal layer 118, e.g., by taping prior to molding or by laser ablation after molding.

An area of the backside metal layer 518 matches an area of the inactive surface 514 of the semiconductor die 510. In some examples, backside metal layer 518 is provided by metal plating and exposed surface of inactive surface 514. In other examples, backside metal layer 518 matching an area of the inactive surface 514 of the semiconductor die 510 is provided by the backside metal layer 518 being on the inactive surface 514 of the semiconductor die 510 before singulation (e.g., backside metal layer 518 is deposited on the inactive surface 514 of the substrate while the semiconductor die 510 is in wafer form. In either case, backside metal layer 518 provides a direct thermal path from the silicon layer to the external surface of package 500, improving the thermal portion of package 500.

In some examples, a clip or a heatsink may be attached to backside metal layer 518 to further improve conductive cooling. Otherwise, backside metal layer 518 may be directly exposed to air in an end product to facilitate convective cooling of package 500.

Mold compound 532 may have a greater height than mold compound 132 in order to partially cover semiconductor die 510. In some examples, backside metal layer 518 may be coplanar with surrounding portions of mold compound 532 on an outer surface of package 500. In other aspects, mold compound 532 is the same as mold compound 132. In this manner, package 100 may provide a thinner version of a standard SOT package, whereas package 500 is typically limited to the maximum height of a standard SOT package.

As with package 300, semiconductor die 510 may have a larger profile in the X-Y plane than semiconductor die 110, as semiconductor die 510 merely needs to fit within the length and width of mold compound 532 of package 500, rather than within cavity 130. However, both semiconductor die 110 and semiconductor die 510 may provide relative thin profiles in order to fit within the height of a standard SOT package.

Figure 7:
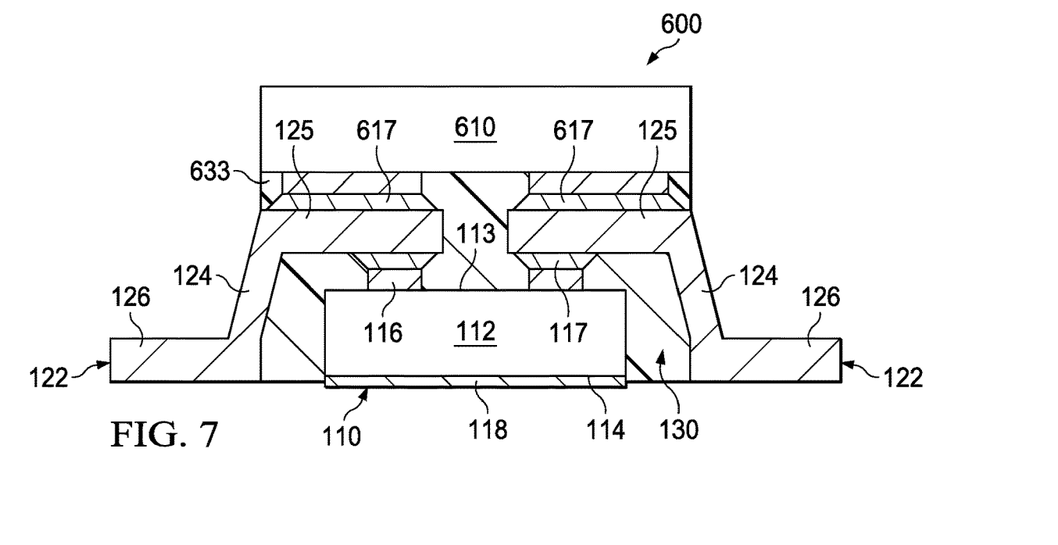
FIG. 7 illustrates a package with a topside passive component and an undermounted semiconductor die with undermold, but not overmold, facilitating improved convective cooling.

FIG. 7 illustrates package 600. Like package 100, package 600 conforms to a standard SOT package size and includes semiconductor die 110 undermounted on leads 122 within cavity 130. In addition to the components of package 100, package 600 further includes a topside passive component 610 mounted to internal leadfingers portions 125 opposite semiconductor die 110. In package 600 mold compound 633 is undermolded on passive component 610, facilitating improved convective cooling by providing increase exposed surface area for the top mounted component compared to packages 300, 400, 500.

Passive component 610 is electrically coupled to internal leadfinger portions 125 via solder joints 617. In a variation of package 600, a second semiconductor die, such as semiconductor die 510, may replace passive component 610 within package 600. Like semiconductor dies 310, 510 such a semiconductor die may be electrically coupled to internal leadfinger portions 125 with flip-chip solder connections.

Mold compound 633 may have a greater height than mold compound 132 in order to cover the surface of passive component 610 adjacent to internal leadfinger portions 125. In other aspects, mold compound 633 is the same as mold compound 132. In this manner, package 100 may provide a thinner version of a standard SOT package, whereas package 600 is typically limited to the maximum height of a standard SOT package.

As with package 300, passive component 610 may have a larger profile in the X-Y plane than semiconductor die 110, as passive component 610 merely needs to fit within the length and width of mold compound 633 of package 600, rather than within cavity 130. However, both semiconductor die 110 and passive component 610 may provide relative thin profiles in order to fit within the height of a standard SOT package.

The specific techniques for packages with a semiconductor die undermounted on a leadframe with an exposed backside surface, including techniques described with respect to packages 100, 300, 400, 500, 600, are merely illustrative of the general inventive concepts included in this disclosure as defined by the following claims.

What is claimed is:

1. A semiconductor package, comprising:
   a semiconductor die with an active surface and an inactive surface, the active surface including metal pillars providing electrical connections to functional circuitry of the semiconductor die;
   a backside metal layer on the inactive surface, wherein the backside metal layer is attached to the inactive surface;
   a plurality of leads with each of the leads including an internal leadfinger portion and an exposed portion that includes a bonding portion, wherein distal ends of the metal pillars are in contact with and electrically coupled to the internal leadfinger portions;
   wherein the backside metal layer is exposed on an outer surface of the semiconductor package;
   wherein the bonding portions and the backside metal layer are approximately planar to each other;
   a passive component mounted to the internal leadfinger portions opposite the semiconductor die;
   mold compound covering the internal leadfinger portions of the leads and partially covering the semiconductor die and the passive component; and
   wherein the passive component includes an exposed surface.

2. The semiconductor package of claim 1, wherein the plurality of leads include bends collectively forming a leadframe upset, wherein the semiconductor die is within a cavity formed by the leadframe upset.

3. The semiconductor package of claim 1, further comprising mold compound covering the internal leadfinger portions of the leads and partially covering the semiconductor die.

4. The semiconductor package of claim 3, wherein the mold compound surrounding the backside metal layer is approximately planar to the backside metal layer and the bonding portions.

5. The semiconductor package of claim 3,
   wherein the backside metal layer is exposed on an X-Y surface of the semiconductor package,
   wherein the plurality of leads form two rows of leads extending in a Y dimension of the X-Y surface,
   wherein a length of the mold compound in the Y dimension is between about 1 millimeter (mm) and about 6.5 mm,
   wherein a width of the mold compound in an X dimension of the X-Y surface is between about 0.6 mm and about 3.5 mm, and
   wherein a height of the mold compound in a Z dimension generally perpendicular to the X-Y surface is between about 0.2 mm and about 1.8 mm.

6. The semiconductor package of claim 5,
   wherein the length of the mold compound in the Y dimension is between about 2.8 mm and about 3 mm, and
   wherein the width of the mold compound in the Z dimension is between about 1.2 mm and about 1.4 mm.

7. The semiconductor package of claim 6, wherein the height of the mold compound in the Z dimension is between about 0.3 mm and about 0.4 mm.

8. The semiconductor package of claim 6,
   further comprising a passive component mounted to the internal leadfinger portions opposite the semiconductor die,
   wherein the passive component is in contact with and electrically coupled to the internal leadfinger portions,
   wherein the passive component is at least partially covered by the mold compound, and
   wherein the height of the mold compound in the Z dimension is between about 0.5 mm and about 1.3 mm.

9. The semiconductor package of claim 3, wherein portions of the plurality of leads covered by the mold compound and include bends forming distal feet that include the bonding portions.

10. The semiconductor package of claim 1, wherein the semiconductor die is electrically coupled to the passive component via the internal leadfinger portions.

11. The semiconductor package of claim 1,
   wherein the semiconductor die is a first semiconductor die,
   the package further comprising a second semiconductor die mounted to the internal leadfinger portions opposite the first semiconductor die.

12. The semiconductor package of claim 11, wherein the first semiconductor die is electrically coupled to the second semiconductor die via the internal leadfinger portions.

13. The semiconductor package of claim 1, wherein the bonding portions of the plurality of leads and the backside metal layer include metal plating.

14. A semiconductor package, comprising:
a first semiconductor die with an active surface and an inactive surface, the active surface including metal pillars providing electrical connections to functional circuitry of the semiconductor die;
a backside metal layer on the inactive surface, wherein the backside metal layer is attached to the inactive surface; and
a plurality of leads with each of the leads including an internal leadfinger portion and an exposed portion that includes a bonding portion, wherein distal ends of the metal pillars are in contact with and electrically coupled to the internal leadfinger portions;
wherein the bonding portions and the backside metal layer are approximately planar to each other;
a second semiconductor die mounted to the internal leadfinger portions opposite the first semiconductor die;
mold compound covering the internal leadfinger portions of the leads and partially covering the first semiconductor die and the second semiconductor die;
wherein the backside metal layer is exposed on an outer surface of the semiconductor package; and
wherein the second semiconductor die includes an exposed surface.

15. A method of forming a semiconductor package comprising:
positioning metal pillars extending from an active surface of a semiconductor die against internal leadfinger portions of a plurality of leads, the metal pillars providing electrical connections to functional circuitry of the semiconductor die;
electrically coupling distal ends of the metal pillars to the internal leadfinger portions of the plurality of leads;
molding a mold compound to cover the internal leadfinger portions of the leads and partially cover the semiconductor die;
locating bonding portions of exposed portions of each of the plurality of leads to be approximately planar with a backside metal layer over an inactive surface of the semiconductor die; and
ablating the mold compound to expose the inactive surface of the semiconductor die on an external surface of the package.

16. The method of claim 15,
wherein the plurality of leads include bends collectively forming a leadframe upset, and
wherein positioning metal pillars extending from the active surface of the semiconductor die against the internal leadfinger portions includes positioning the semiconductor die within a cavity formed by the leadframe upset.

17. The method of claim 15, further comprising, prior to the molding, applying tape to shield the inactive surface of the semiconductor die from the mold compound.

18. The method of claim 15, further comprising, after the molding, metal plating the bonding portions of the plurality of leads and the backside metal layer.

19. The method of claim 15, wherein electrically coupling the distal ends of the metal pillars to the internal leadfinger portions of the plurality of leads includes reflowing the metal pillars so that distal ends of the metal pillars become electrically coupled to the internal leadfinger portions of the plurality of leads.

20. The method of claim 15, further comprising, prior to the molding, mounting a passive component to the internal leadfinger portions opposite the semiconductor die,
wherein the molding at least partially covers the passive component.

21. The method of claim 15,
wherein the semiconductor die is a first semiconductor die,
the method further comprising, prior to the molding, mounting a second semiconductor die to the internal leadfinger portions opposite the first semiconductor die,
wherein the molding at least partially covers the second semiconductor die.

22. The method of claim 15, further comprising, prior to the molding, bending the exposed portions of each of the plurality of leads to form feet including the bonding portions.

23. A method of forming a semiconductor package comprising:
positioning metal pillars extending from an active surface of a first semiconductor die against internal leadfinger portions of a plurality of leads, the metal pillars providing electrical connections to functional circuitry of the first semiconductor die;
positioning metal pillars extending from an active surface of a second semiconductor die against an opposing side of the internal leadfinger portions of the plurality of leads, the metal pillars providing electrical connections to functional circuitry of the second semiconductor die;
electrically coupling distal ends of the metal pillars to the internal leadfinger portions of the plurality of leads;
molding a mold compound to cover the internal leadfinger portions of the leads and partially cover the first semiconductor die and the second semiconductor die, wherein the second semiconductor die includes an exposed surface; and
locating bonding portions of exposed portions of each of the plurality of leads to be approximately planar with a backside metal layer over an inactive surface of the first semiconductor die.

24. The method of claim 23, wherein the second semiconductor device is a passive component.

25. The method of claim 23,
wherein the plurality of leads include bends collectively forming a leadframe upset, and
wherein positioning metal pillars extending from the active surface of the semiconductor die against the internal leadfinger portions includes positioning the semiconductor die within a cavity formed by the leadframe upset.

26. The method of claim 23, further comprising, prior to the molding, applying tape to shield the inactive surface of the semiconductor die from the mold compound.

27. The method of claim 23, further comprising, after the molding, metal plating the bonding portions of the plurality of leads and the backside metal layer.

28. The method of claim 23, wherein electrically coupling the distal ends of the metal pillars to the internal leadfinger portions of the plurality of leads includes reflowing the metal pillars so that distal ends of the metal pillars become electrically coupled to the internal leadfinger portions of the plurality of leads.

29. The method of claim 23, further comprising, prior to the molding, bending the exposed portions of each of the plurality of leads to form feet including the bonding portions.

\* \* \* \* \*